US009306552B1

(12) United States Patent
Brennan et al.

(10) Patent No.: US 9,306,552 B1
(45) Date of Patent: Apr. 5, 2016

(54) HIGH VOLTAGE MAXIMUM VOLTAGE SELECTOR CIRCUIT WITH NO QUIESCENT CURRENT

(71) Applicant: LINEAR TECHNOLOGY CORPORATION, Milpitas, CA (US)

(72) Inventors: Ciaran J. Brennan, Essex Junction, VT (US); Mukesh Kumar, Fairfax, VT (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/593,813

(22) Filed: Jan. 9, 2015

Related U.S. Application Data

(60) Provisional application No. 62/047,432, filed on Sep. 8, 2014.

(51) Int. Cl.
*H03K 17/00* (2006.01)
*H03K 5/1532* (2006.01)

(52) U.S. Cl.
CPC .................................... *H03K 5/1532* (2013.01)

(58) Field of Classification Search
CPC ... H03K 17/693; H03K 17/005; H03K 17/74; H03K 17/6257; H04J 3/047
USPC ............. 327/407, 408, 530, 534, 535; 307/64
See application file for complete search history.

(56) References Cited

U.S. PATENT DOCUMENTS

| | | | |
|---|---|---|---|
| 5,304,864 A | 4/1994 | Hong et al. | |
| 7,893,566 B2 * | 2/2011 | Yarbrough et al. | 307/130 |
| 8,022,574 B2 | 9/2011 | Ryoo | |
| 8,120,984 B2 * | 2/2012 | Huang et al. | 365/226 |
| 8,773,168 B2 | 7/2014 | Huang | |
| 2014/0140157 A1 | 5/2014 | Huott et al. | |
| 2014/0232435 A1 | 8/2014 | Herrera et al. | |

OTHER PUBLICATIONS

Zhang, Y. et al. 2012. Input-Self-Biased Transient-Enhanced Maximum Voltage Tracker for Low-Voltage Energy-Harvesting Applications. IEEE Transactions on Power Electronics, vol. 27, No. 5, May 2012, pp. 2227-2229.

* cited by examiner

*Primary Examiner* — Quan Tra
(74) *Attorney, Agent, or Firm* — McDermott Will & Emery LLP

(57) ABSTRACT

A maximum voltage selection circuit may include multiple inputs, each for receiving a different input voltage, an output for delivering the highest of the input voltages, and a voltage selection circuit. The voltage selection circuit may automatically select the input having the largest voltage magnitude, automatically deliver the voltage at the selected input to the output, and not draw quiescent operating current from any of the inputs. For each and every unique combination of two of the multiple inputs, the voltage selection circuit may include an enhancement mode FET with a channel connected in series between a first input of the unique combination of the two inputs and the output; a connection between the gate of the enhancement mode FET and the second input of the unique combination of the two inputs through the channel of a depletion mode FET; an additional enhancement mode FET with a channel connected in series between the second of the unique combination of the two inputs and the output; and a connection between the gate of the additional enhancement mode FET and the first of the unique combination of the two inputs through the channel of an additional depletion mode FET.

14 Claims, 5 Drawing Sheets

HIGH VOLTAGE MAXIMUM VOLTAGE SELECTOR CIRCUIT WITH NO QUIESCENT CURRENT

CROSS-REFERENCE TO RELATED APPLICATION

This application is based upon and claims priority to U.S. provisional patent application 62/047,432, entitled "High Voltage Maxer Circuit with No Q-Current," filed Sep. 8, 2014. The entire content of this application is incorporated herein by reference.

BACKGROUND

1. Technical Field

This disclosure relates to circuits that automatically select and deliver the highest of multiple different input voltages to an output.

2. Description of Related Art

Some analog systems may need to automatically deliver the maximum of two or more input voltages. A maximum voltage selection circuit may be used for this purpose.

Such a circuit may need to operate continuously. This could impose a continuous load burden, which could be a problem for applications that rely on a battery for operation. A maximum voltage selection circuit that does not draw any quiescent current from any of its inputs or from its output may be highly desirable in such applications.

Efforts to address these needs have been made. See, e.g., U.S. Pat. No. 5,304,864, entitled "Analog Maximum/Minimum Selector Circuit," U.S. Pre-Grant Patent Publication US2014/0232435A1, entitled "Analog Minimum or Maximum Voltage Selector Circuit," and Y. Zhang et al., "Input-Self-Biased Transient-Enhanced Maximum Voltage Tracker for Low-Voltage Energy-Harvesting Applications", IEEE Trans. On Power Electronics, Vol. 27, No. 5, pp. 2227-30 (May 2012). However, these techniques may require bias current in amplifiers to generate the maximum voltages. In addition, these techniques may require complex and costly circuitry. These approaches may also limit the input voltages, such as to a maximum of 5 volts.

SUMMARY

A maximum voltage selection circuit may include multiple inputs, each for receiving a different input voltage, an output for delivering the highest of the input voltages, and a voltage selection circuit. The voltage selection circuit may automatically select the input having the largest voltage magnitude, automatically deliver the voltage at the selected input to the output, and not draw quiescent operating current from any of the inputs. For each and every unique combination of two of the multiple inputs, the voltage selection circuit may include an enhancement mode FET with a channel connected in series between a first input of the unique combination of the two inputs and the output; a connection between the gate of the enhancement mode FET and the second input of the unique combination of the two inputs through the channel of a depletion mode FET; an additional enhancement mode FET with a channel connected in series between the second of the unique combination of the two inputs and the output; and a connection between the gate of the additional enhancement mode FET and the first of the unique combination of the two inputs through the channel of an additional depletion mode FET.

All of the FETs may be PFETs or all of the FETs may be NFETs.

The magnitude of the pinch-off voltage of the depletion mode FETs may exceed the turn-on voltage of the enhancement mode FETs.

The maximum voltage selection circuit may include a gate-to-body voltage clamp that prevents the voltage between the gate and the body of at least one of the enhancement mode FETs from exceeding its gate-to-body breakdown voltage.

The maximum voltage selection circuit may include a gate-to-source voltage clamp that prevents the voltage between the gate and the source of at least one of the enhancement mode FETs from exceeding its gate-to-source breakdown voltage.

The maximum voltage selection circuit may include a body-to-source voltage clamp that prevents the voltage between the body and the source of at least one of the enhancement mode FETs from exceeding its body-to-source breakdown voltage.

The voltage selection circuit may not draw quiescent operating current from the output.

There may be only two inputs.

There may be more than two inputs. For each of the inputs, the channels of the enhancement mode FETs that are connected in series between the input and the output may themselves be connected in series.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Maximum voltage selection circuits will now be described that may receive two or more voltages inputs. These circuits may not provide any direct current path between the inputs. Still further, no operational quiescent current may be drawn during operation from any of their inputs. These circuits may be suitable for applications where one of the supplies is a low power source such as a battery or energy harvester.

By saying that no operational quiescent current may be drawn during operation from any of the inputs, it should be understood that there may still be a very small current, typically a few pico Amperes to a few nano Amperes, that are drawn from each input for each of the devices that are connected to that input due to finite junction leakage in these devices. Such small leakage currents are not considered to be a deviation from the statement that no operational quiescent current is drawn.

The maximum voltage selection circuits may select the input voltage with the greatest magnitude and deliver it an output. Although there may be no limit to the input voltage levels, the implementation may use MOSFET devices that can only handle drain to source voltages equal to the maximum expected voltage differential between any two inputs. An example voltage input range may therefore be from 0V to 60V or from 0V to 200V.

Such a maximum voltage selector circuit may be used for many different applications. For example, a maximum voltage selector circuit may be connected between a power supply input and an output with a PFET driver in an integrated circuit. The PFET driver may connect the output to the power supply input while in a conducting state. The PFET driver may be required to switch into a non-conducting state when the output voltage is driven above the first power supply voltage by a second power supply connected to the output. In this condition, the PFET may be turned off by the control circuit inside the integrated circuit to prevent conduction from the second power supply into the first power supply. In order to keep the PFET output driver off, its gate voltage may be connected to the maximum of the first power supply voltage and the output voltage. The maximum voltage selector circuits described herein may be capable of providing that voltage without drawing current from either power supply. This can be an advantage in a battery powered circuit, where keeping the output PFET off without consuming current may avoid unnecessary power drain on the battery.

Figure 1:
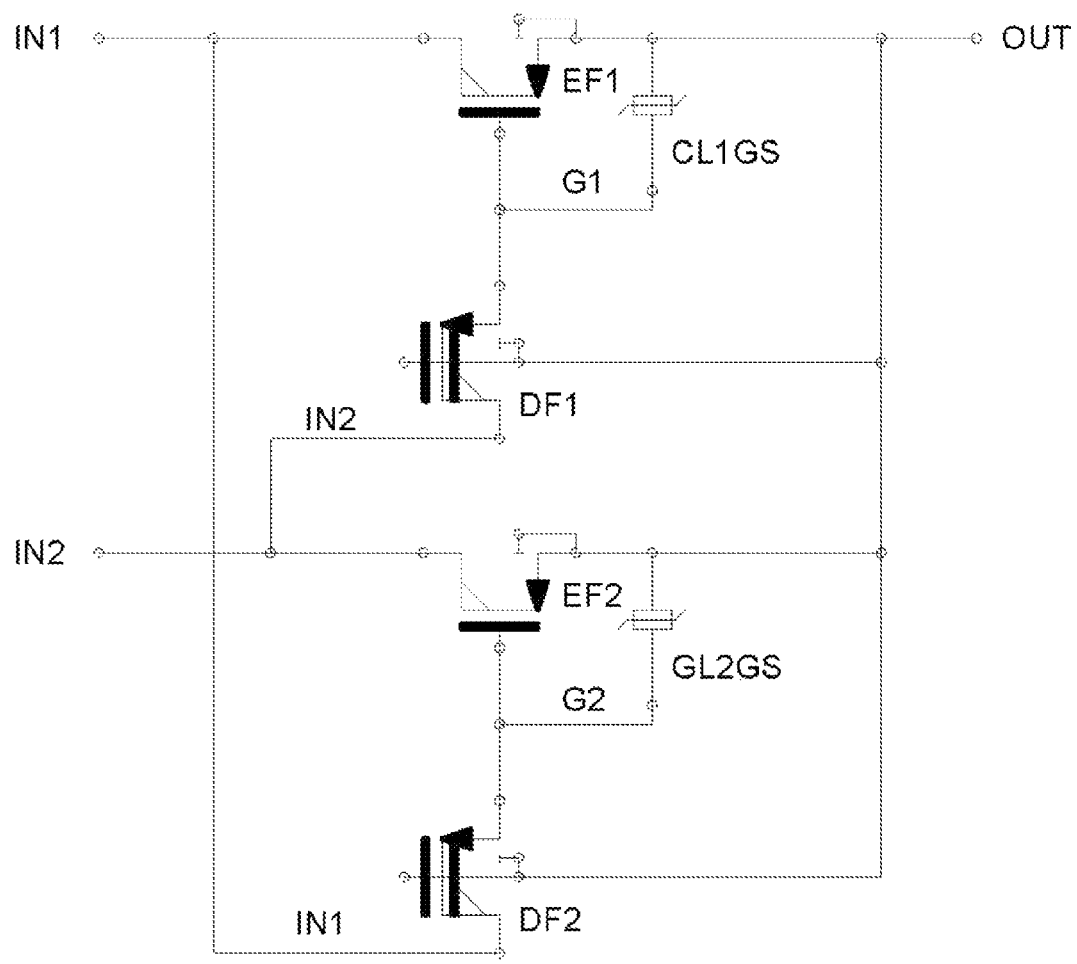
FIG. 1 illustrates an example of a high voltage maximum voltage selector circuit that has two inputs and draws no quiescent current from its inputs or output.

FIG. 1 illustrates an example of a high voltage maximum voltage selector circuit that receives different input voltages at two inputs IN1 and IN2 and draws no quiescent current from its inputs or output. The higher of the two input voltages may be connected to the output OUT through enhancement mode PFETs EF1 or EF2, depending on which input voltage is higher.

Figure 2:
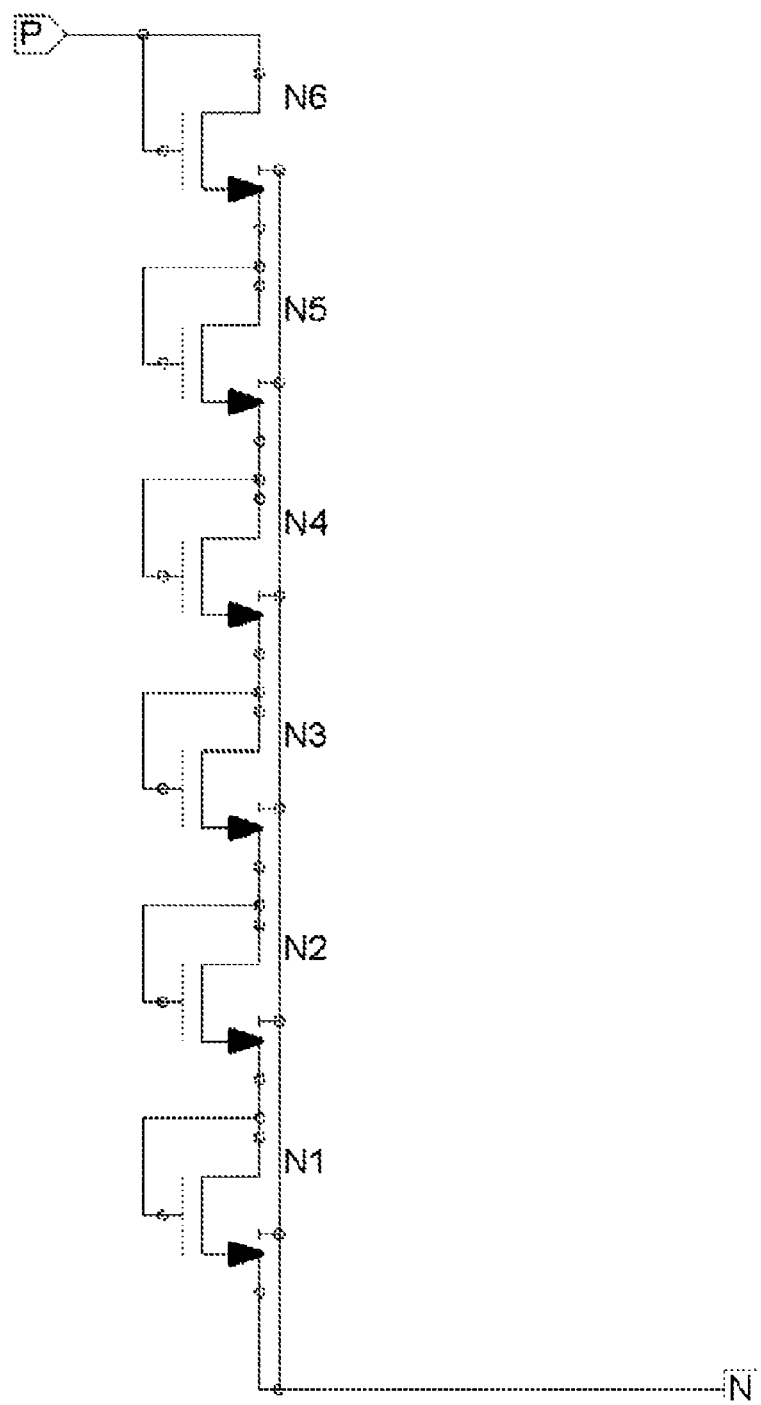
FIG. 2 illustrates an example of diode sub-string circuits that may be used for the clamps CL1GS and CL2GS shown in FIG. 1.

The gates of the enhancement mode PFETs EF1 and EF2 may be cross-coupled to IN2 and IN1 through depletion mode PFETs DF1 and DF2, respectively. Gate-to-source voltage clamps CL1GS and CL2GS may limit the negative voltage swing on the gate of the enhancement mode PFETs EF1 and EF2, respectively, with respect to the output OUT. These clamps may prevent the gates of the enhancement mode PFETs EF1 and EF2 from getting overstressed during transients or due to sub-threshold conduction of depletion mode PFETs DF1 and DF2. The conduction (or breakdown) voltage of the gate-to-source voltage clamps CL1GS and CL2GS may be smaller than the gate-to-source breakdown voltages of the enhancement mode PFETs EF1 and EF2, but larger than the pinch off voltage of the depletion mode PFETs DF1 and DF2 to prevent DC conduction. The gate-to-source voltage clamp CL1GS and CL2GS may be NFET diode string sub-circuits, an example of which is illustrated in FIG. 2.

Figure 3:
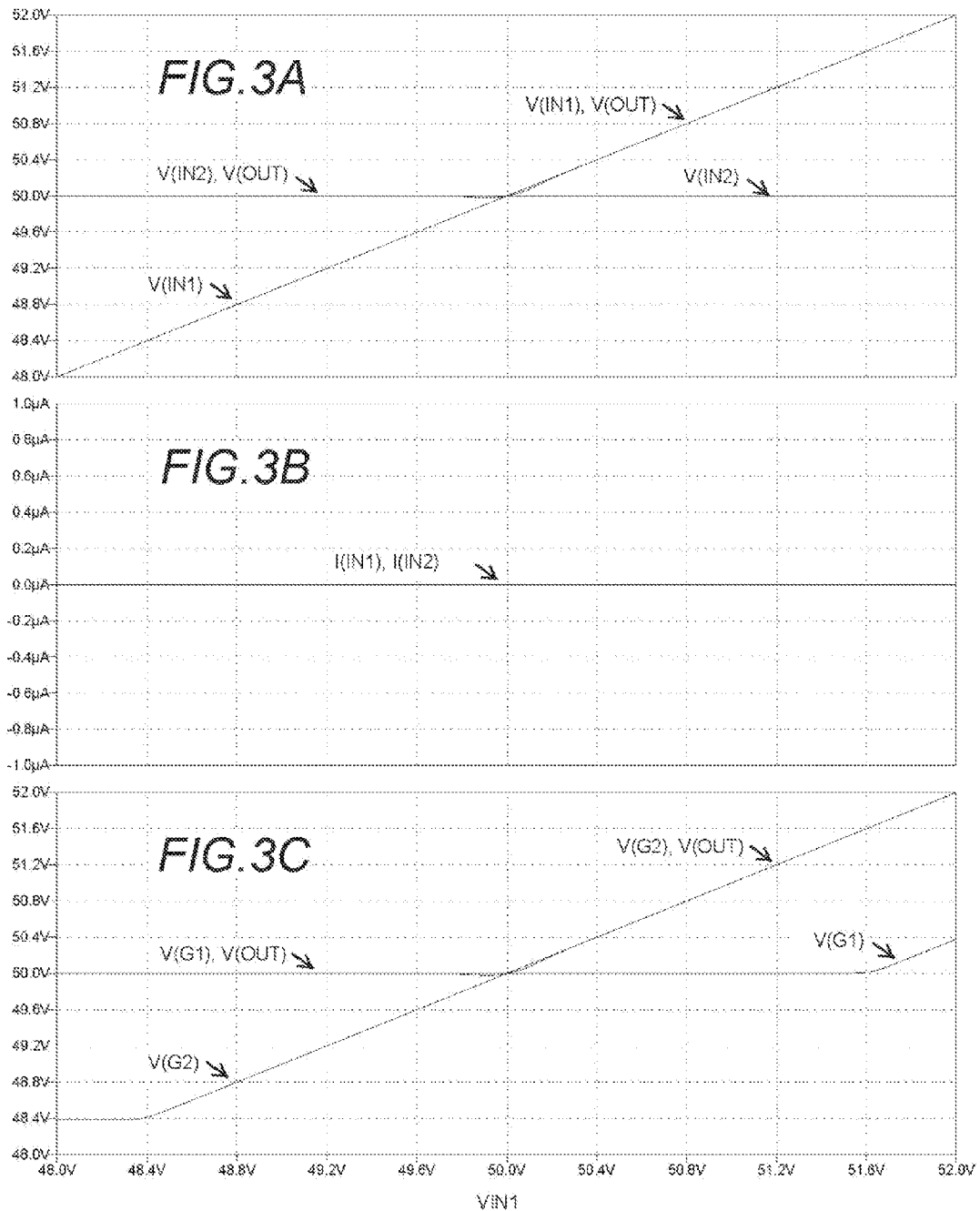
FIG. 3A illustrates an example of simulation results of input voltages at the inputs IN1 and 1N2 and an output voltage at the output OUT.
FIG. 3B illustrates an example of simulation results of input currents at the inputs IN1 and 1N2.
FIG. 3C illustrates an example of simulation results of gate voltages V(G1) and V(G2) at the gates of the enhancement mode PFETs EF1 and EF2, respectively.

A detailed description is given below for an example where the input IN1 is swept from 48V to 52V while the input IN2 is held fixed at 50V. The pinch off voltage of the depletion mode PFETs DF1 and DF2 is assumed to be 1.6V, while the threshold voltage of the enhancement mode PFETs is assumed to be 0.7V. FIG. 3A illustrates an example of simulation results of input voltages at the inputs IN1 and IN2 and an output voltage at the output OUT; FIG. 3B illustrates an example of simulation results of input currents at the inputs IN1 and IN2; and FIG. 3C illustrates an example of simulation results of gate voltages V(G1) and V(G2) at the gates of the enhancement mode PFETs EF1 and EF2, respectively.

1) V(IN1)<V(IN2)−1.6V: The gate of the enhancement mode PFET EF2 is connected to IN1 through the depletion mode PFET DF1. EF2 is turned on and conducts the voltage from IN2 to OUT because the voltage V(G2) on its gate is lower than its threshold voltage. V(G2) goes below the gate voltage of the depletion mode PFET DF2 (which is at V(OUT)) by about 1.6V, where DF2 pinches off and ceases to conduct, thus protecting the gate of EF2. The gate of the enhancement mode PFET EF1 is connected to IN2 through the depletion mode PFET DF1. EF1 is turned off and isolates IN1 from OUT because the voltage V(G1) on its gate is higher than its threshold voltage.

2) V(IN2)−1.6V<V(IN1)<V(IN2)−0.7V: The enhancement mode PFET EF1 remains off with its gate voltage V(G1) at V(IN2). The voltage on the gate of the enhancement mode PFET EF2 V(G2) follows V(IN1) as the depletion mode PFET DF2 turns on. Since V(G2) is below the threshold voltage of the enhancement mode PFET EF2, it remains on and V(OUT)=V(IN2).

3) V(IN2)−0.7V<V(IN1)<V(IN2)+0.7: Both enhancement mode PFETs EF1 and EF2 are turned off. IN1 to OUT conduction occurs through the drain to body diodes of the PFETs EF1 and DF2, while the conduction from IN2 to OUT occurs through the drain-to-body diodes of the PFETs EF2 and DF1. The output voltage at OUT falls one diode drop below the higher of IN1 and IN2 if any current is drawn from OUT. FIG. 3B illustrates operation with no current drawn from OUT.

4) V(IN2)+0.7V<V(IN1)<V(IN2)+1.6V: The voltage on the gate of the enhancement mode PFET EF1 remains at V(IN2). Therefore, as V(IN1) rises above V(IN2) by the threshold voltage of the enhancement mode PFET EF1, the enhancement mode PFET EF1 turns on, connecting IN1 to OUT. V(G2) follows IN1 though the depletion mode PFET DF2, thus keeping the enhancement mode PFET EF2 off and isolating IN2 while IN1 is connected to OUT.

5) V(IN2)+1.6V<V(IN1): The enhancement mode PFET EF2 remains shut off with its gate at V(IN1). Enhancement PFET EF1 remains on, conducting the voltage on IN1 to OUT. The voltage on the gate of PFET EF1 follows about 1.6V (the pinch off voltage of the depletion mode PFET PG1) below V(OUT), thus protecting the gate of EF1.

Figure 4:
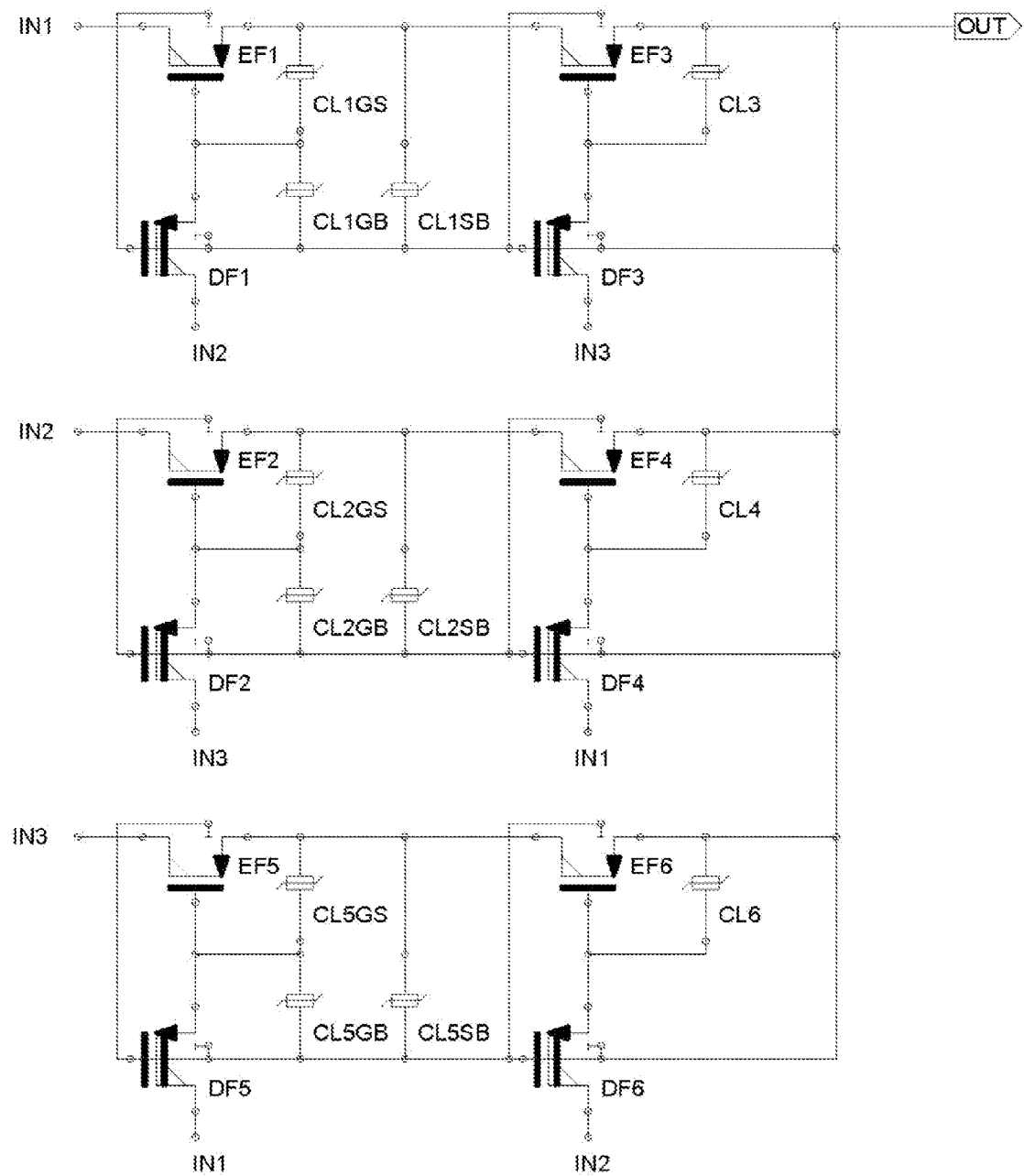
FIG. 4 illustrates an example of a high voltage maximum voltage selector circuit that has three inputs and draws no quiescent current from its inputs or output.

FIG. 4 illustrates an example of a high voltage maximum voltage selector circuit that has three inputs and draws no quiescent current from its inputs or output. Enhancement mode PFETs EF1-6 may be of the same as the enhancement mode PFETs EF1 and EF2 in FIG. 1; depletion mode PFETs DF1-6 may be the same as the depletion mode PFETs DF1 and DF2 in FIG. 1; gate-to-source voltage clamps CL1GS, CL2GS, CL5GS, CL3, CL4, and CL6 may be the same as the gate-to-source voltage clamps CL1GS and CL2GS in FIG. 1;

gate-to-body voltage clamps CL1GB, CL2GB, and CL5GB may prevent the voltage between the gate and the body of the enhancement mode PFET to which they are connected from exceeding its gate-to-body breakdown voltage; and source-to-body voltage clamps CL1SB, CL2SB, and CL5SB may prevent the voltages between the source and the body of the enhancement mode PFET to which they are connected from exceeding its source-to-body breakdown voltage. Although three voltage clamps are illustrated as being associated with the first of each input's enhancement mode PFET, any one, two, of all three of them may be omitted. Similarly, the voltage clamps associated with the second of each input's enhancement mode PFET may also be omitted. The other considerations discussed above in connection with FIG. 1 may also apply here.

Figure 5:
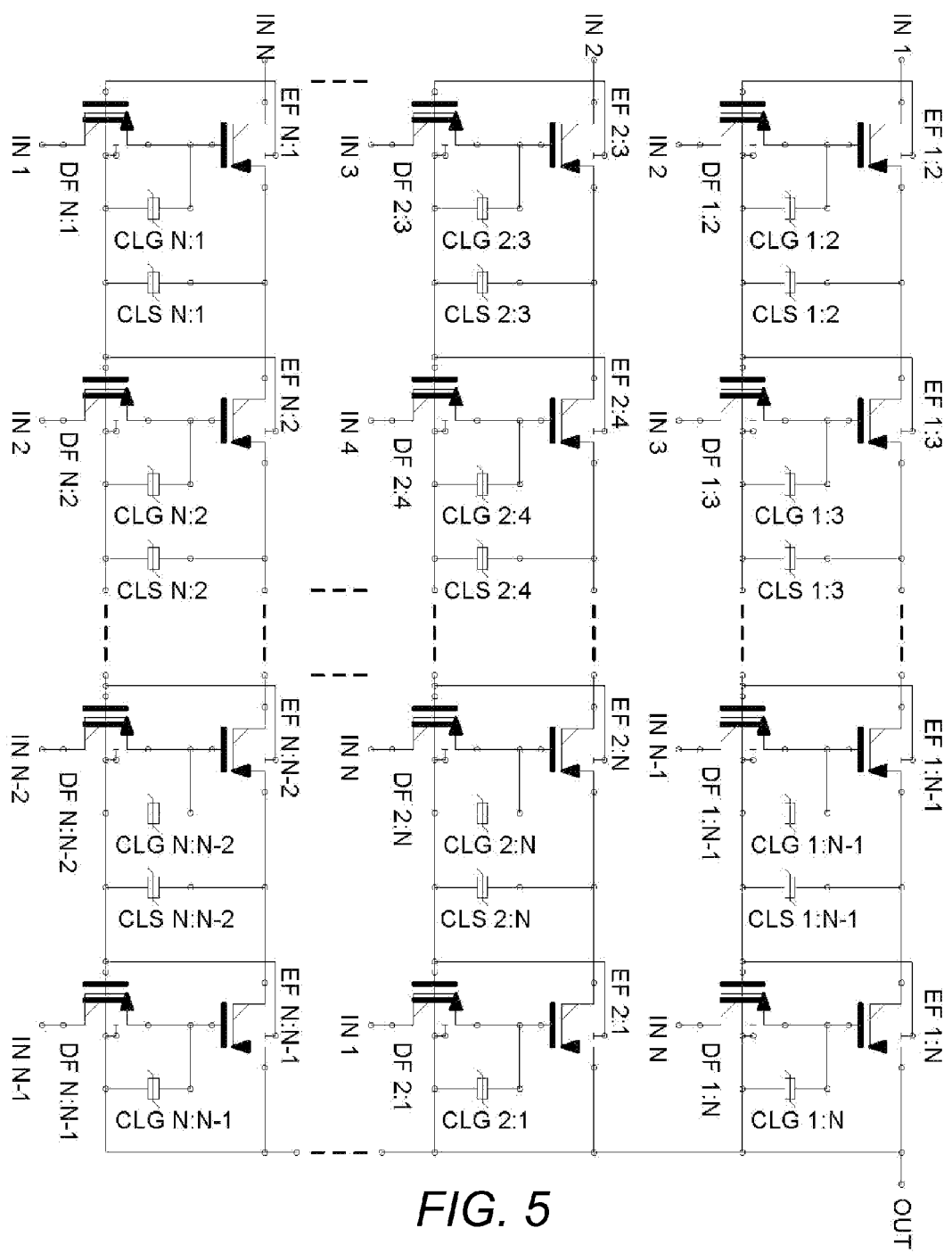
FIG. 5 illustrates an example of a high voltage maximum voltage selector circuit that has four or more inputs and draws no quiescent current from its inputs or output.

FIG. 5 illustrates an example of a high voltage maximum voltage selector circuit that has four or more inputs and draws no quiescent current from its inputs or output. All of its components may be the same as the corresponding ones in FIG. 4 and be governed by the other considerations discussed above in connection with FIGS. 1 and 4.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, all of the PFETs in the various figures could be replaced by NFETs, such as when the input and output voltages are negative. Two or more of the component devices discussed above may be combined into an integrated semiconductor structure that performs the functions of several component devices; for example, a depletion FET may be integrated into the gate of an enhancement FET structure, or a voltage clamp may be integrated into the source or drain of a FET structure. Furthermore, while all the FET devices illustrated in the figures are MOSFETs, the invention may be implemented using JFETs or other types of semiconductor devices, or even non-semiconductor switching electronic devices such as vacuum tubes or vacuum transistors.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A maximum voltage selection circuit comprising:
multiple inputs, each for receiving a different input voltage;
an output for delivering the highest of the input voltages; and
a voltage selection circuit that:
automatically selects the input having the largest voltage magnitude;
automatically delivers the voltage at the selected input to the output; and
does not draw quiescent operating current from any of the inputs,
wherein for each and every unique combination of two of the multiple inputs, the voltage selection circuit comprises:
an enhancement mode FET with a channel connected in series between a first input of the unique combination of the two inputs and the output, the enhancement mode FET also having a gate;
a connection between the gate of the enhancement mode FET and the second input of the unique combination of the two inputs through the channel of a depletion mode FET;
an additional enhancement mode FET with a channel connected in series between the second of the unique combination of the two inputs and the output, the additional enhancement mode FET having a gate; and a connection between the gate of the additional enhancement mode FET and the first of the unique combination of the two inputs through the channel of an additional depletion mode FET.

2. The maximum voltage selection circuit of claim 1 wherein all of the FETs are pFETs or all of the FETs are nFETs.

3. The maximum voltage selection circuit of claim 1 wherein:
the depletion mode FETs have a pinchoff voltage;
the enhancement modes FETs have a turn-on voltage; and
the magnitude of the pinchoff voltage of the depletion mode FETs exceeds the turn-on voltage of the enhancement mode FETs.

4. The maximum voltage selection circuit of claim 1 wherein:
each enhancement mode FET has a body and a gate-to-body breakdown voltage; and
the maximum voltage selection circuit further comprises a gate-to-body voltage clamp that prevents the voltage between the gate and the body of at least one of the enhancement mode FETs from exceeding its gate-to-body breakdown voltage.

5. The maximum voltage selection circuit of claim 1 wherein:
each enhancement mode FET has a source and a gate-to-source breakdown voltage; and
the maximum voltage selection circuit further comprises a gate-to-source voltage clamp that prevents the voltage between the gate and the source of at least one of the enhancement mode FETs from exceeding its gate-to-source breakdown voltage.

6. The maximum voltage selection circuit of claim 5 wherein:
each enhancement mode FET has a body and a gate-to-body breakdown voltage; and
the maximum voltage selection circuit further comprises a gate-to-body voltage clamp that prevents the voltage between the gate and the body of at least one of the enhancement mode FETs from exceeding its gate-to-body breakdown voltage.

7. The maximum voltage selection circuit of claim 1 wherein:
each enhancement mode FET has a body, a source, and a body-to-source breakdown voltage; and
the maximum voltage selection circuit further comprises a body-to-source voltage clamp that prevents the voltage between the body and the source of at least one of the enhancement mode FETs from exceeding its body-to-source breakdown voltage.

8. The maximum voltage selection circuit of claim 7 wherein:
each enhancement mode FET has a body and a gate-to-body breakdown voltage; and
the maximum voltage selection circuit further comprises a gate-to-body voltage clamp that prevents the voltage between the gate and the body of at least one of the enhancement mode FETs from exceeding its gate-to-body breakdown voltage.

9. The maximum voltage selection circuit of claim 7 wherein:
each enhancement mode FET has a source and a gate-to-source breakdown voltage; and
the maximum voltage selection circuit further comprises a gate-to-source voltage clamp that prevents the voltage between the gate and the source of at least one of the enhancement mode FETs from exceeding its gate-to-source breakdown voltage.

10. The maximum voltage selection circuit of claim 9 wherein:
each enhancement mode FET has a body and a gate-to-body breakdown voltage; and
the maximum voltage selection circuit further comprises a gate-to-body voltage clamp that prevents the voltage between the gate and the body of at least one of the enhancement mode FETs from exceeding its gate-to-body breakdown voltage.

11. The maximum voltage selection circuit of claim 1 wherein the voltage selection circuit does not draw quiescent operating current from the output.

12. The maximum voltage selection circuit of claim 1 wherein the multiple inputs comprise only two inputs.

13. The maximum voltage selection circuit of claim 1 wherein the multiple inputs comprise more than two inputs.

14. The maximum voltage selection circuit of claim 13 wherein, for each of the inputs, the channels of the enhancement mode FETs that are connected in series between the input and the output are themselves connected in series.

* * * * *